United States Patent [19]
Young et al.

[11] Patent Number: 5,457,606
[45] Date of Patent: Oct. 10, 1995

[54] HERMETICALLY SEALED PC CARD UNIT INCLUDING A HEADER SECURED TO A CONNECTOR

[75] Inventors: Paul R. Young, Cromwell; Robert Blake, Middletown; Christopher Staehly, East Haddam; David Richard, Southington; Leonard Bazar, Middletown, all of Conn.

[73] Assignee: Raymond Engineering Inc., Middletown, Conn.

[21] Appl. No.: 178,385

[22] Filed: Dec. 23, 1993

Related U.S. Application Data

[63] Continuation-in-part of Ser. No. 150,497, Nov. 10, 1993, abandoned.

[51] Int. Cl.⁶ ............................ H05K 1/18; H05K 5/06; H01R 13/58; H01R 23/70
[52] U.S. Cl. .................... 361/737; 235/487; 235/492; 361/684; 361/772; 361/829; 439/62; 439/449; 439/629; 439/651
[58] Field of Search ................. 174/52.1; 206/328; 235/492, 487; 257/678, 679; 361/684, 728, 736, 737, 752, 786, 772, 785, 787, 789, 816, 818, 829; 439/59, 62, 76, 78, 82, 83, 79, 80, 629, 630, 636, 637, 638, 651, 937, 449, 452, 460, 474, 377

[56] References Cited

U.S. PATENT DOCUMENTS

| | | | |
|---|---|---|---|
| 4,941,841 | 7/1990 | Darden et al. | 439/377 |
| 5,061,845 | 10/1991 | Pinnavaia | 235/492 |
| 5,070,032 | 12/1991 | Yuan et al. | 437/43 |
| 5,095,344 | 3/1992 | Harari | 257/327 |
| 5,107,073 | 4/1992 | Steffen | 174/52.1 |
| 5,168,465 | 12/1992 | Harari | 257/320 |
| 5,172,338 | 12/1992 | Mehrotra et al. | 365/185 |
| 5,173,840 | 12/1992 | Kodai et al. | 361/737 |
| 5,184,209 | 2/1993 | Kodai et al. | 257/679 |
| 5,198,380 | 3/1993 | Harari | 437/43 |
| 5,200,959 | 4/1993 | Gross et al. | 371/21.6 |
| 5,242,310 | 9/1993 | Leung | 439/76 |
| 5,277,596 | 1/1994 | Dixon | 439/79 |
| 5,279,623 | 1/1994 | Watanabe et al. | 437/220 |
| 5,288,237 | 2/1994 | Mizutani et al. | 439/76 |
| 5,313,364 | 5/1994 | Omori et al. | 361/737 |

FOREIGN PATENT DOCUMENTS

| | | | |
|---|---|---|---|
| 0201236 | 11/1986 | European Pat. Off. | 361/737 |
| WO9326063 | 12/1993 | WIPO | 361/737 |

OTHER PUBLICATIONS

IFEE Transactions On Components, Hybrids, and Manufacturing Technology "Large Area Hybrid Module" vol. Chmt—4, No. 4 Dec. 1981.
J. Comer, Gage Publishing Company; "Applying Glass–To–Metal Seals"; published 1958; Electronic Manufacture.
Sundisk "Ink Development Pen Software For AT&T Eo Personal Communicator Will Be Sold On Sundisk Flash Storage Cards"; Jun. 30, 1993.
Sundisk "Sundisk To Provide Flash Storage Cards For HP 100LX"; May 4, 1993.
Sundisk; Sundisk Flash Storage Cards Designed Into Zoomer PDA; High Capacity Cards Are "Plug And Play"; Jun. 3, 1993.
Sundisk; Sundisk Material; Feb. 1993.
Sundisk; "Sundisk Solid Mass Storage Technology"; May, 1993.
Personal Computer Memory Card International Assocation; Advertising Information "Release Record"; Nov. 1992.

*Primary Examiner*—Donald A. Sparks
*Attorney, Agent, or Firm*—Fishman, Dionne & Cantor

[57] ABSTRACT

An improved PC Card element, particularly a flash card unit, is presented in which the unit is hermetically sealed. The unit has a metallic frame, a metallic header with glass or ceramic encapsulated through pins, and opposed outer metallic covers, all of the metallic elements being of the same metal and being welded together to form a hermetically sealed unit.

12 Claims, 4 Drawing Sheets

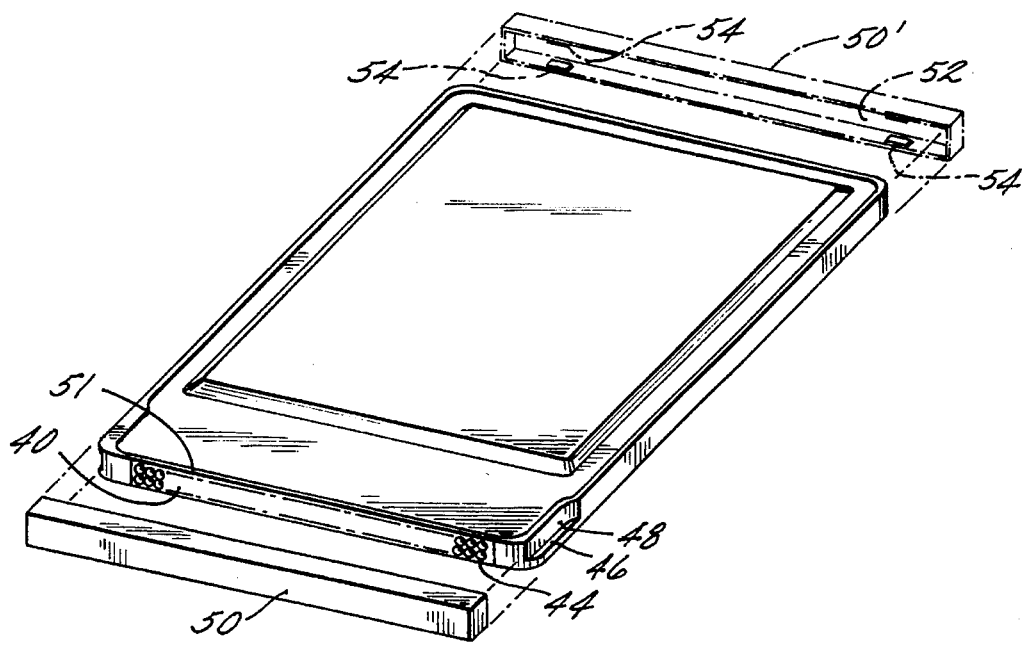
FIG. 5
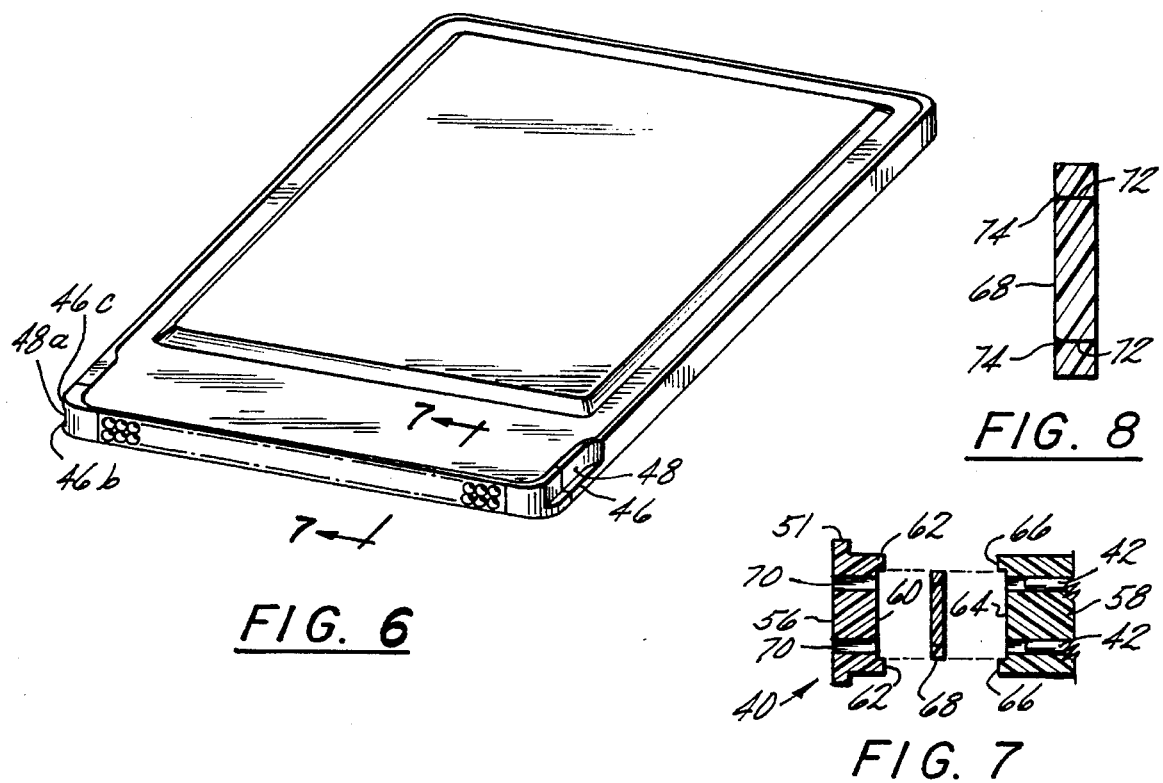
FIG. 6
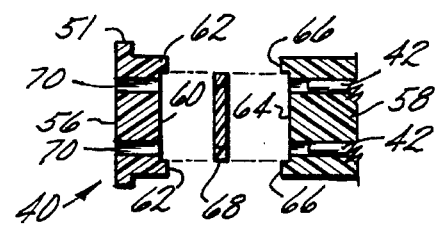
FIG. 8
FIG. 7

HERMETICALLY SEALED PC CARD UNIT INCLUDING A HEADER SECURED TO A CONNECTOR

CROSS-REFERENCE TO RELATED APPLICATION

This application is a continuation-in-part of U.S. application Ser. No. 08/150,497 filed Nov. 10, 1993 now abandoned.

BACKGROUND OF THE INVENTION

This invention relates to the field of PC Cards such as mass storage systems, particularly a solid state mass storage system or memory package known as a flash card. More particularly, this invention relates to a hermetically sealed flash card that is especially suitable for industrial applications where conditions of high humidity and wide temperature ranges are encountered.

PCMCIA Cards, or PC Cards, are add-on devices about the size of a credit card, in length and width, but thicker. PC Cards slide into PCMCIA slots in computers. PC Cards come in several thicknesses, depending on application, which include memory upgrades, modems, network connectors, or even hard disk drives. At present, PC Cards are known as Type I, Type II and Type III. These three cards all have 68 pin connectors at the end and are of the same length and width; but they differ in height or thickness. Type I cards generally contain software programs or extra memory. Type II cards typically house modems (e.g., data and fax) and network adapters. Type III cards are thick enough to accommodate removable hard disk drives and wireless communication devices. It is conceivable that in the future even thicker cards, i.e., Type IV and higher designations, may be introduced.

The term "flash card", "memory card", "PC Card" and "PCMCIA Card" will be used interchangeably herein. Flash card memory packages or mass storage systems currently exist which are compatible with PCMCIA standards. Such flash card units are available from Sundisk Corporation of Santa Clara, Calif. These existing flash card units from Sundisk have a plastic frame in which a memory card is retained. A plastic connector houses metallic pins which extend from the rear of the connector. The rearwardly facing pins are soldered directly to printed circuit lines on the memory card and the connector is loosely retained in notches in the frame. The frame and memory card are sandwiched between layers of insulating material and stainless steel outer covers on opposite sides of the frame and memory card. The stainless steel outer covers are bonded to the plastic frame by adhesive. The outer surface of the frame adjacent the connector has a keyway which complements a shoulder on the slot in the computer to ensure that the flash card is inserted in the right orientation. If an attempt is made to insert the card upside down, interference between the shoulder on the slot and the keyway structure on the card will prevent full insertion of the card into the slot.

While suitable for their intended purposes, some of the specifications for presently available flash cards make them inappropriate or unsuitable for industrial applications where high humidity environments and wide temperature ranges are encountered. In particular the present humidity specification for Sundisk flash cards is 8%–95%, non-condensing, for both operating and non-operating conditions, while the specification for temperature is 0° C. to 65° C. for operating conditions and –20° C. to +85° C. for non-operating conditions. Those specifications, particularly the humidity specification, limit the usefulness of the flash cards in certain industrial applications, and it is highly desirable to have a flash card with improved characteristics, especially in regard to humidity.

Also, a need has been identified to protect the connector pins of PC Cards from dirt and other contamination when not in use.

SUMMARY OF THE INVENTION

In accordance with this invention, a flash card is presented which satisfies the requirement of 0–100% condensing humidity for both non-operating and operating conditions. In addition, a desirable objective for the flash card of the present invention is that it satisfy a requirement for a nonoperating temperature range of from about –40° C. to +90° C. and an operating temperature range of from about –25° C. to +80° C. However, it will be understood that the improved humidity characteristic of the flash card of the present invention is by far the more important feature, even if temperature range improvement relative to existing flash cards is not achieved.

In accordance with the present invention, the circuit board or memory card is retained in a metal frame. The connector is also housed in the frame at a position spaced from the memory card. A header is welded in position in the frame between the memory card and the connector. The header is constructed of the same metal as the frame, and the header has a plurality of lead passages formed therein. Conducting pins pass through the lead passages and each pin is encapsulated in glass or ceramic in the header. The pins from the header are solder connected at one end to printed circuit lines on the memory card; and the other ends of the header pins are soldered to pins extending from the rear of the connector. The flash card assembly is completed by layers of insulating material on opposite sides of the memory card, and by outer metallic cover layers on opposite sides of the memory card welded to the frame. The frame, header and outer metal covers are all of the same metallic material, and the welding together of these elements, along with the glass or ceramic encapsulation of the header pins, results in a hermetically sealed flash card unit which can meet the requirement for 0–100% condensing humidity.

As an added benefit, it is also hoped that the flash card of the present invention will satisfy a temperature range requirement of from –40° C. to +95° C.; but the invention will be considered a success even if this temperature range cannot be achieved.

The present invention also presents several embodiments to prevent or minimize contamination of the connector pins which might otherwise occur from the environment to which the connector is exposed. The foregoing and other features and advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGURES:

FIG. 5 is a perspective view showing an end cap embodiment for protecting the connector against contamination.

FIG. 6 is a perspective view of an elastomeric seal embodiment for protecting the connector against contamination.

FIG. 7 is a sectional view along line 7—7 of FIG. 6.

FIG. 8 is an enlarged view of the elastomeric seal of FIG. 7.

DESCRIPTION OF THE PREFERRED EMBODIMENT

Figure 4:
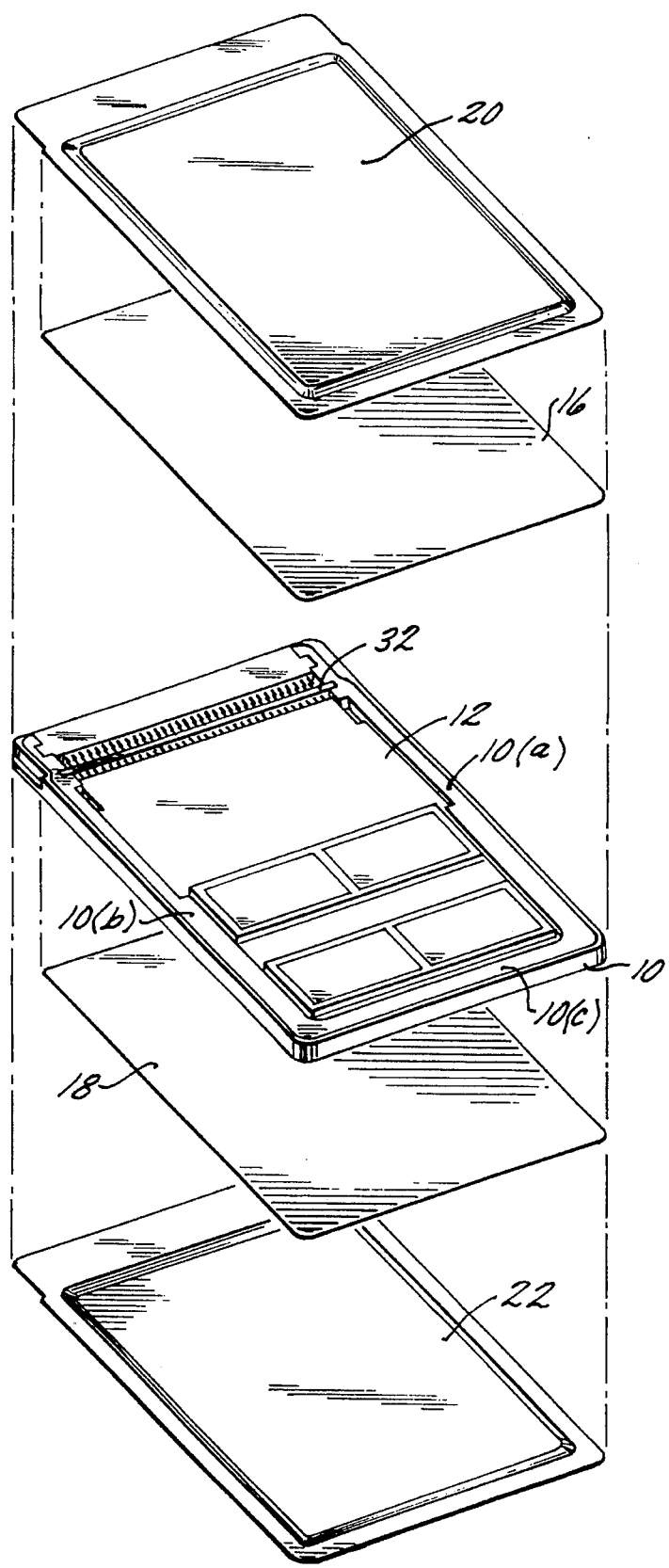
FIG. 4 is an exploded view showing the elements of the flash card of the present invention.

Referring first to FIG. 4, an exploded view of the flash card unit of the present invention is shown. The flash card unit has a rectangular metal frame 10 in which a circuit board/memory card 12 is retained. The details of circuit board/memory card 12 are not relevant to this invention, so the circuit board/memory card is shown only schematically. Those skilled in the art will know that circuit board/memory card 12 contains solid state memory chips, associated electronic circuitry, and printed circuit patterns interconnecting the memory chips and circuitry to each. The printed circuit patterns include connector pads 14 (see FIG. 2) for connecting the circuit board/memory card to the outside wall.

Still referring to FIG. 4, the flash card unit also includes a pair of thin (about 0.001 inch) plastic polyimide (Kapton) insulating layers 16 and 18 on each side of frame 10 and memory card 12, and a pair of metallic covers 20 and 22. Layers 16 and 18 are actually a single sheet of material wrapped around memory card 10, but for convenience of illustration they are shown as upper and lower sheets in FIG. 4. In final assembly, metallic covers 20 and 22 are welded to metallic frame 10 to form part of the hermetic sealing of the flash card unit.

Figure 1:
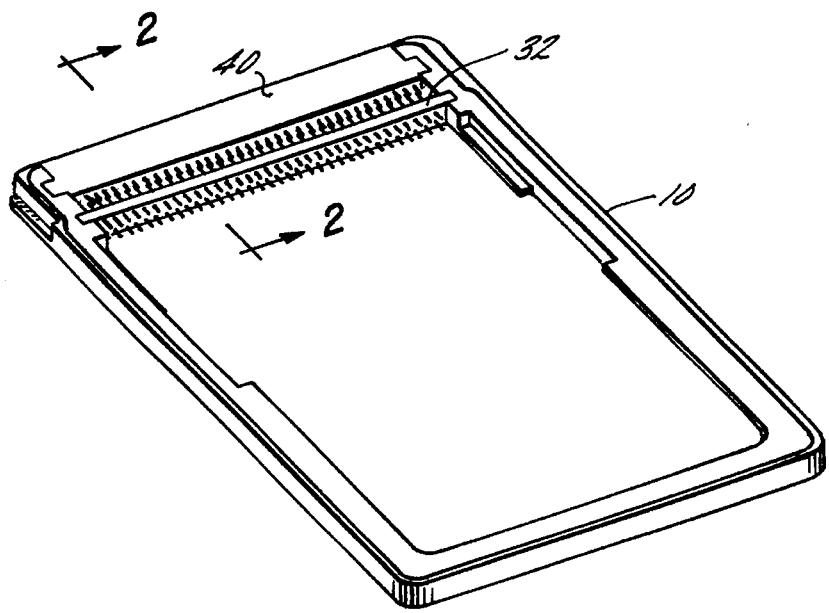
FIG. 1 is a perspective view of the frame of the flash card of the present invention, with header and connector in place.
Figure 3:
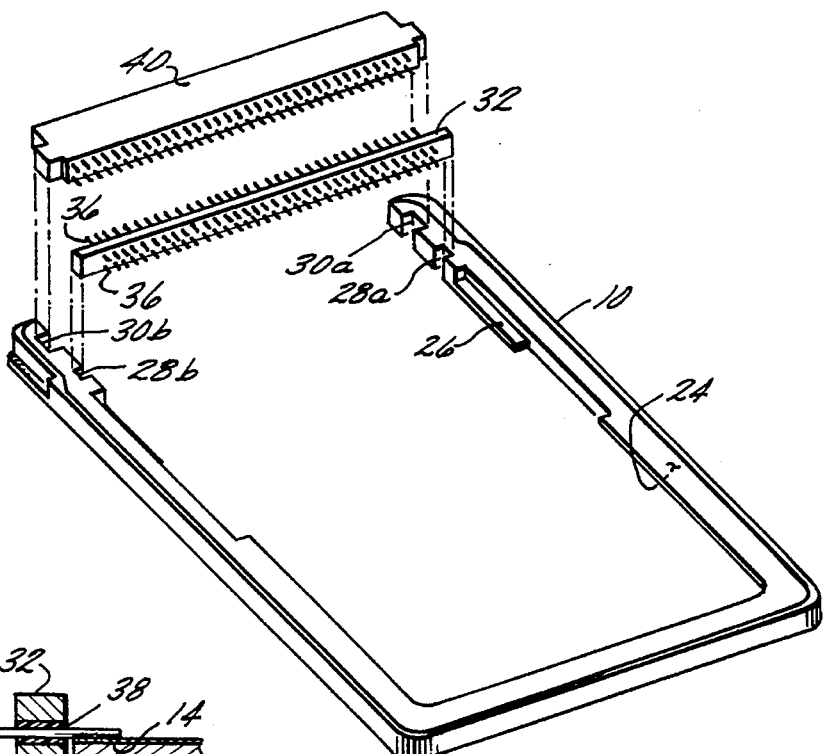
FIG. 3 is an exploded view of FIG. 1.
Figure 2:
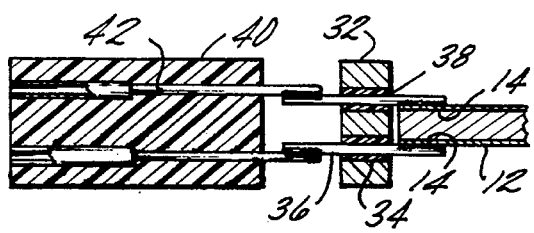
FIG. 2 is a detail showing the header-connector interface.

Referring now to FIGS. 1–3, frame 10 has upper and lower side ledges 24 and 26 on opposed side to house and retain memory card 12. The front end of frame 10 is open and has two pairs of notches 28a, 28b and 30a, 30b. A metallic header 32 (see also FIG. 2) has end portions sized and shaped to mate with notches 28a and 28b; and header 32 is positioned in the notches 28a, 28b and is welded to frame 10. As best seen in FIG. 2, header 32 has a plurality of through holes 34, through which pass conductive metallic pins 36. Each pin 36 extends on opposite sides of header 32 and is encapsulated in its hole 34 by glass encapsulating material 38. The glass 38 in each hole 34 fully occupies all of the space in each hole around each pin 36, and the glass is firmly bonded to the pin and to the surface of the hole to also provide hermetic sealing for the flash card unit. The encapsulating material for pins 36 could also be ceramic.

A plastic connector 40 has end portions sized and shaped to mate with notches 30a, 30b, and plastic connector 40 is engaged in and retained in the notches 30a, 30b in frame 10. Connector 40 has a plurality of pins 42 which are open at their forward ends to receive male plugs, and which extend rearwardly from connector 40. As best shown in FIG. 2, the rearwardly extending parts of the pins 42 are lapped to and soldered to the forwardly projecting parts of respective pins 36 of header 32, and the rearwardly projecting parts of header pins 36 are lapped to and soldered to connector pads 14 of the circuit patterns on memory card 12.

Frame 10, header 30 and covers 20 and 22 are all made from the same metal, which may be any weldable metal such as, e.g., stainless steel or aluminum. Spinodal copper, which is an alloy of copper, nickel and tin available from Diehl GmbH of Rothenbach, Germany, is being investigated for use because it is relatively machinable and can be hardened by thermal processing at about 320° C.

In the assembly of the flash card of the present invention, memory card 12 (around which the thin layer of insulating material has previously been wrapped and secured with polyimide tape) is mounted in frame 10, and the header 32 and connector 40 are then mounted into their respective notices 28a, 28b and 30a, 30b. The pins of header 32 are then soldered to connector pins 42 and to circuit pads 14. Header 32 is then welded in place in frame 10. Then, covers 20 and 22 are placed on opposite sides of frame 10 and welded to the frame at the two sides 10(a) and 10(b) .and at the end 10(c). The forward ends of the covers 20 and 22 also extend over header 32 and cover most of connector 40; and the covers are also welded to header 32. As an alternative method of construction, header 32 can be welded into notches 28a and 28b before the header pins 36 are soldered to the contact pads 14 and connector pins 42. In either method of assembly, header 32 and connector 40 are mounted into their respective notches in the frame as a single unit, with the overlapping of the pins 42 and 36 (see FIG. 2) keeping the header 32 and connector 40 together prior to those pins being soldered. All welding is preferably by a continuous weld process such as electron beam or laser welding.

The fact that the covers 20 and 22 are welded all around to the frame 10 and the header 32, coupled with the fact that the pins 36 are encapsulated and sealed in glass 38 in the header, results in a completed flash card unit that is hermetically sealed and meets the requirement for 0–100% condensing humidity. The temperature range for the flash card units in the prior art was limited because the memory card 10 tends to absorb moisture at higher temperatures. However, since the flash card unit of the present invention is hermetically sealed, the card 10 is not exposed to moisture, and, thus, the sealed unit should also have improved temperature characteristics. Thus, it is anticipated that the flash card unit of this invention should satisfy temperature requirements for an operating temperature range of from about −25° C. to +80° C. and a nonoperating temperature range of from about −40° C. to +90° C.

If desired, e.g., for military application, the individual memory chips and circuit elements on card 10 can also be individually encapsulated. Also, the bonding of header 32 and covers 20 and 22 to frame 10 can be accomplished by soldering or any other method that will provide moisture-tight bonds.

It will also be noted that instead of a solid state memory card, a modem, a network connector, a magnetic memory disc drive, or any other computer related component could be housed and hermetically sealed within frame 10, with the rest of the unit, including frame 10, header 32 and covers 20, 22 being as previously described. This would produce a hermetically sealed PCMCIA Card having the desirable humidity and temperature characteristics described above for the flash card unit.

FIG. 5 shows the PC Card unit of the present invention from a front perspective view in which the front openings 44 to pins 42 are seen in connector 40. A keyway structure at the front of frame 10, prevents insertion of the PC Card into the computer slot in the wrong orientation. This keyway structure, which is a part of the prior art, consists of a shoulder 46 and a recess 48 on one side of the frame, while on the other side of the frame a recess 48a is sandwiched between upper and lower shoulders 46a and 46b. When the PC Card is presented to the computer slot in the correct orientation, the recess 48 mates with a complementary shoulder (not shown) on the slot in the computer (also not shown) into which the PC Card is inserted to permit full insertion of the PC Card into the slot for operation. However, if the PC Card is presented to the computer slot in the wrong direction, i.e., upside down, then the shoulders 46a and 46b on the other side of frame 10 will interfere with the shoulder on the slot, and the PC Card will be blocked from full insertion into the slot.

There is concern, particularly in industrial and other severe environments, that dirt, dust, moisture and/or other contaminants may enter openings 44 and clog or otherwise impair the interior of one or more of the female sections of pins 42. To combat such contamination to some degree, one simple measure that could be adopted is to place a cover 50 over the front of frame 10 to cover the openings 44 to the pins in connector 40 when the PC Card is removed from the computer. Cover 50 is shown in solid lines in FIG. 5 juxtaposed to the front end of the PC Card. Cover 50 is also shown in phantom (as 50') juxtaposed to the rear of the PC Card, where the cover may be stored for safekeeping when it is removed from the front end of the PC Card. Cover 50 may be a molded plastic part having a hollow interior 52 with snap fastener elements 54 to latch over a small lip on connector 40 at the front end of the PC Card to retain the cover on the PC Card (lip 51 being seen best in FIG. 7).

Referring to FIGS. 6, 7 and 8, a more elaborate seal or barrier mechanism is shown for combatting contamination of pins 42. In this embodiment, connector 40 is composed of two parts, a front segment 56 and a rear segment 58. The rear face of front segment 56 has a recess 60 surrounded by a shoulder or border 62, and the front face of rear segment 58 has a recess 64 surrounded by a shoulder or border 66. In the final assembled unit, the front and rear segments 56, 58 are bonded together at shoulders or borders 62 and 66 to form a chamber in which an elastomeric seal or barrier element 68, e.g., silicone rubber, is housed. Elastomeric element 68 is bonded to the opposed facing surfaces of recesses 60 and 64. The pins 42 are housed in rear segment 58, and the front segment 56 has pin free passages 70 which are aligned with the pins 42. As best seen in FIG. 8, elastomer element 68 has a plurality of slits 72 which are aligned with the passages 70 and pins 42. Each slit 72 may have a small conical entry portion 74. It will be understood that one of each of the slits 72 is aligned with a pin 42 and its respective passage 70. Elastomeric element 68 serves to seal the PC Card against entry of contaminants. The slits 72 are very thin, so that the opposite sides of each slit are essentially in contact and the resilience and compliance of elastomeric element 68 essentially seals the slits when the PC Card is not mated to male pins on a plug within a computer. When the PC Card is inserted in the computer, the male pins from the plug pass through passages 70 and slits 72 to enter and make contact with pins 42. In that state, the slits are forced open to permit passage of the male pins, but the walls of the slits 72 surround and contact the male pins to provide sealing. Thus, elastomeric element provides a sealing function for the PC Card both when the PC Card is in and out of a computer.

Figure 9:
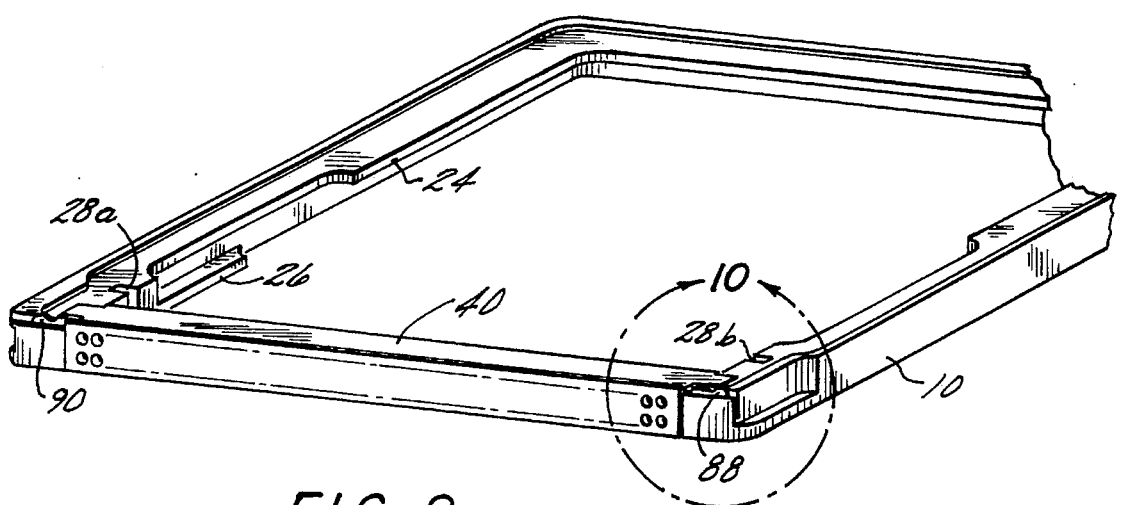
FIG. 9 is a perspective view of a shutter embodiment for protecting the connector against contamination.
Figure 10:
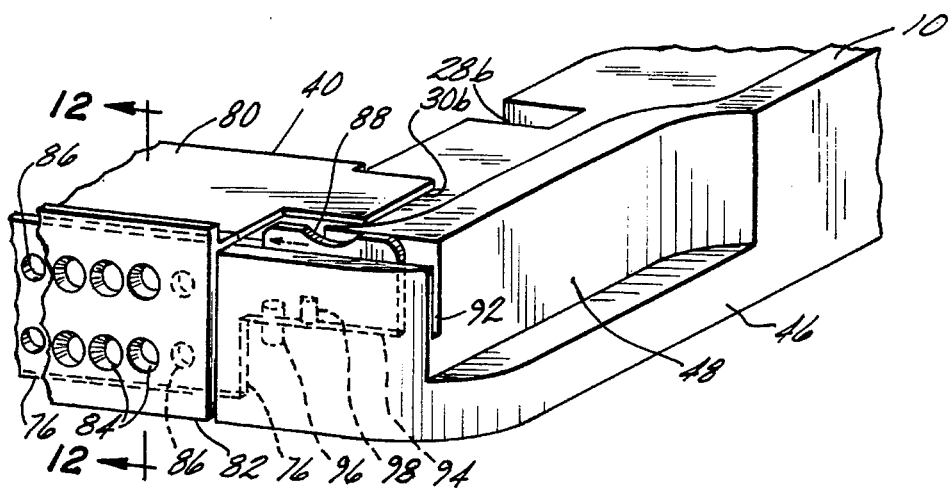
FIG. 10 is a detail of the shutter of FIG. 9.
Figures 11, 12:
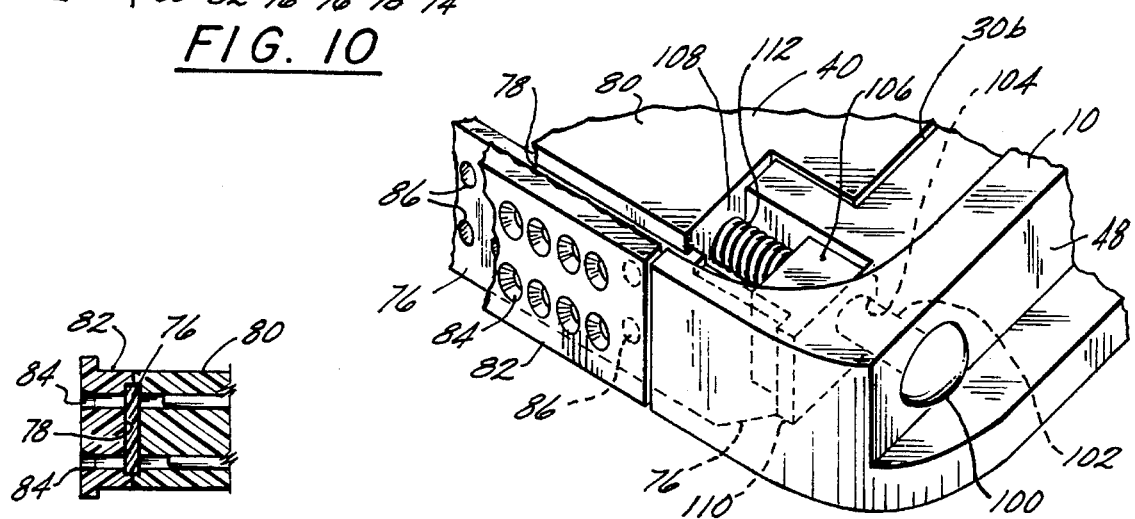
FIG. 11 is a perspective view of another embodiment of the shutter protector.
FIG. 12 is a sectional view along line 12—12 of FIG. 10.

Referring next to FIGS. 9–11, two more seal or barrier embodiments are shown. These embodiments incorporate a moveable shutter mechanism for combatting contamination. The shutter 76 is a thin sheet of plastic material (see FIGS. 10 and 11) which rides in a chamber or slot 78 (best seen in FIG. 11) near the front of connector 40. The pins 42 are housed in the rear part 80 of connector 40 to the rear of slot 78, and the front part 82 has pinless entry passages 84 aligned with each of the pins 42 in the rear part. Shutter 76 has a plurality of holes 86 equal in number to the passages 84 in the front connector part 82 and the pins 42 in the rear connector part 80. Shutter 76 and the holes 86 in shutter 76 are sized and positioned so that in a first position of shutter 76 the holes 86 align with the passages 84 and the pins 42, and in a second position of shutter 76 the holes 86 are out of alignment with the passages 84 and pins 42, and the material of shutter 76 between holes 76 blocks and seals communication between passages 84 and pins 42.

The slot 78 which houses shutter 76 is best seen in FIG. 11, which is partly broken away to show the chamber or slot 78. It should, however, be understood that front connector part 82 and rear connector part 80 are separate pieces bonded together at facing top and bottom shoulders to form the chamber 78, see FIG. 12, with end passages to permit the lateral movement of shutter 76.

In the embodiment of FIGS. 9 and 10, shutter 76 is connected at each of its left and right ends to manually operable switches 88 and 90, respectively. Referring particularly to the detail of FIG. 9, switch 88 rides in a notch 92 at the front end of frame 10 and forward of notch 32b, and a reduced size portion 92 of shutter 76 is adhered to switch 88. An elastomeric element in the form of a cylinder 96 is housed in a recess in notch 92 behind switch 88, and switch 88 is provided with a corresponding notch 98. The structure of notch 92, reduced position 94, elastomeric cylinder 96 and notch 98 is repeated at the left end of the frame in conjunction with switch 90. In operation, manual movement of switch 88 to the left (as seen in FIGS. 9 and 10), moves shutter 76 and switch 90 leftward to an "open" position where shutter holes 86 are brought into alignment with entry passages 84 and pins 42 in connector segment 80, so that male plug pins in the computer can be inserted into the PC Card to contact pins 42. When switch 88 is moved leftward, notch 98 passes over elastomeric element 96, whereby elastomeric element 96 expands slightly and engages notch 98 to lightly hold switch 88 and shutter 76 in the open position to prevent unintentional movement of shutter 76. Similarly, when the PC Card has been removed from the computer and it is desired to seal the pins 42 against contamination, switch 90 (or 88) is moved to the right to a "closed" position, whereby the shutter material between adjacent holes 76 is brought into alignment with passages 84 to block and seal off the communication between passages 84 and pins 42. The structure of elastomeric cylinder 96 and thumb switch notch 98 are repeated for switch 90, so the shutter is also lightly held in the closed position to prevent unintentional movement to the open position.

Referring to FIG. 11, the shutter mechanism, per se, is the same as in the embodiment of FIGS. 9 and 10, but the actuation mechanism is different. In place of the manually actuated thumb switches of FIGS. 9 and 10, the embodiment of FIG. 11 has an automatic actuation mechanism. That automatic actuation mechanism includes a sliding button 100 at the end of a cylinder 102 which rides in a passageway 104 in frame 10. to be more precise, button 100 is located in recess 48 adjacent the front end of the frame. Cylinder 102 is connected to a rectangular block 106 which is located in a chamber 108 in frame 10 slightly forward of notch 30b. One end of block 106 has an extended portion which rides in a slot in the front of frame 10 to maintain the alignment and orientation of block 106, cylinder 102 and button 100. Shutter 76 is adhered to block 106 at the right end of the shutter. The rear side of block 106, i.e., the side opposite to button 100 is spring loaded to the right by a spring 112 to move button 100 to the right (as shown in FIG. 11) and to move shutter 76 to the closed position whereby communication between passages 84 and pins 42 is blocked and sealed off when the PC Card is removed from the computer. However, when the PC Card is inserted in the computer slot, the orientation shoulder in the computer slot engages recess 48 and pushes pin 100 to the left against the force of spring 112 as the PC Card is moved into the computer. That leftward movement of pin 100 moves block 106 and shutter 76 leftward to the open position of the shutter, whereby the male pins of the computer internal plug can enter passageways 84 and contact pins 42 in the PC Card. On removal of the PC Card from the computer (actually on removal past the orientation shoulder on the slot), the force of spring 112 will move button 100 and shutter 76 rightward to the closed position to seal the pins 72 against contamination.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A hermetically sealed PC Card, including:

a frame;

an electronic unit retained in said frame, said unit including circuit elements;

a header bonded to said frame, said header including a plurality of conductive pins passing through and being encapsulated in the header, said pins extending forward and rearward from said header, said rearwardly extending pins being bonded to said circuit elements;

a connector retained in said frame adjacent to and forward of said header, said connector having rearwardly facing pins which are bonded to the forwardly extending pins of said header;

first and second covers bonded to said frame and said header in sealing engagement therewith, said frame, said header, and said first and second covers cooperating to form a hermetically sealed space in which said electronic unit is located; and means for protecting said pins of said connector from environmental contamination.

2. A hermetically sealed PC Card as in claim 1 wherein said protecting means includes:

barrier means in said connector for protecting said pins of said connector from environmental contamination.

3. A hermetically sealed PC Card as in claim 2 wherein said barrier means includes:

elastomeric seal means located between said pins of said connector and an entrance to said connector, said elastomeric seal means including slits therein to permit passage of pins to contact said pins of said connector.

4. A hermetically sealed PC Card as in claim 2 wherein said barrier means includes:

a shutter located between said pins of said connector and an entrance to said connector, said entrance having a plurality of passages corresponding to and in alignment with said pins of said connector;

a plurality of openings in said shutter, said openings being in an array corresponding to said pins in said connector and the passages in the entrance to said connector; and means for moving said shutter between a first position in which said openings in said shutter are aligned with said pins in said connector and with said passages in said entrance to said connector and a second position in which said openings of said shutter are out of alignment with said pins in said connector and said passages in said entrance to said connector and said shutter inhibits environmental contamination of said pins in said connector.

5. A hermetically sealed PC Card as in claim 4, and further including:

manually operable actuator means for moving said shutter between said first and second positions.

6. A hermetically sealed PC Card as in claim 4, and further including:

actuator means responsive to engagement or disengagement of said frame with structure with which said PC Card is to be used for moving said shutter between said search and first positions.

7. A hermetically sealed PC Card unit, including:

a frame, said frame having opposed side portions joined by a rear portion;

first and second pairs of notches in said side portions near the ends thereof removed from said rear portion;

an electronic unit retained in said frame, said unit including circuit elements;

a header retained in the first pair of said notches and extending between said side portions of said frame; said header being bonded to said frame, said header including a plurality of conductive pins passing through and being encapsulated in the header, said pins extending forward and rearward from said header, said rearwardly extending pins being bonded to said circuit elements;

a connector retained in the second pair of notches and extending between said side portions of said frame at a position adjacent to said header on the side of said header removed from the rear portion of the frame, said connector having rearwardly facing pins which are bonded to the forwardly extending pins of said header;

first and second covers bonded to said frame and said header in sealing engagement therewith, said frame, said header, and said first and second covers cooperating to form a hermetically sealed space in which said electronic unit is located; and means for protecting said pins of said connector from environmental contamination.

8. A hermetically sealed PC Card as in claim 7 including:

barrier means in said connector for protecting said pins of said connector from environmental contamination.

9. A hermetically sealed PC Card as in claim 8 wherein said barrier means includes:

seal means located between said pins of said connector and an entrance to elastomeric said connector, said elastomeric seal means including slits therein to permit passage of pins to contact said pins of said connector.

10. A hermetically sealed PC Card as in claim 8 wherein said barrier means includes:

a shutter located between said pins of said connector and an entrance to said connector, said entrance having a plurality of passages corresponding to and in alignment with said pins of said connector;

a plurality of openings in said shutter, said openings being in an array corresponding to said pins in said connector and the passages in the entrance to said connector; and means for moving said shutter between a first position in which said openings in said shutter are aligned with said pins in said connector and with said passages in said entrance to said connector and a second position in which said openings of said shutter are out of alignment with said pins in said connector and said passages in said entrance to said connector and said shutter inhibits environmental contamination of said pins in said connector.

11. A hermetically sealed PC Card as in claim 10, and further including:

manually operable actuator means for moving said shutter between said first and second positions.

12. A hermetically sealed PC Card as in claim 10, and further including:

actuator means responsive to engagement or disengagement of said frame with structure with which said PC Card is to be used for moving said shutter between said second and first positions.

* * * * *